United States Patent
Shirane et al.

(10) Patent No.: US 9,472,707 B2
(45) Date of Patent: Oct. 18, 2016

(54) INFRARED DETECTOR

(71) Applicant: NEC Corporation, Tokyo (JP)

(72) Inventors: Masayuki Shirane, Tokyo (JP); Yuichi Igarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/649,166

(22) PCT Filed: Jun. 6, 2013

(86) PCT No.: PCT/JP2013/003560
§ 371 (c)(1),
(2) Date: Jun. 2, 2015

(87) PCT Pub. No.: WO2014/087549
PCT Pub. Date: Jun. 12, 2014

(65) Prior Publication Data
US 2016/0218233 A1    Jul. 28, 2016

(30) Foreign Application Priority Data
Dec. 5, 2012  (JP) ................ 2012-266162

(51) Int. Cl.
*H01L 31/058*   (2006.01)
*H01L 21/00*    (2006.01)
(Continued)

(52) U.S. Cl.
CPC ....... *H01L 31/118* (2013.01); *H01L 31/03046* (2013.01); *H01L 31/035218* (2013.01); *H01L 31/119* (2013.01)

(58) Field of Classification Search
CPC .................................. H01L 31/118
USPC ............................ 257/470; 438/54
See application file for complete search history.

(56) References Cited

U.S. PATENT DOCUMENTS

| 5,206,526 A | 4/1993 | Liu et al. |
| 7,601,946 B2* | 10/2009 | Powers ............ B82Y 15/00 |
| | | 250/226 |

(Continued)

FOREIGN PATENT DOCUMENTS

| EP | 0514077 | 11/1992 |
| JP | 5-129645 | 5/1993 |

(Continued)

OTHER PUBLICATIONS

International Search Report corresponding to PCT/JP2013/003560, mail date Sep. 17, 2013, 2 pages.

*Primary Examiner* — Calvin Lee
(74) *Attorney, Agent, or Firm* — Wilmer Cutler Pickering Hale and Dorr LLP

(57) ABSTRACT

An infrared detector includes a semiconductor substrate, a first contact layer formed on the semiconductor substrate, a light-absorbing layer formed on the first contact layer, a second contact layer formed on the light-absorbing layer, and a voltage source that applies a voltage between the first contact layer and the second contact layer. The light-absorbing layer includes at least a part in which a first intermediate layer, a quantum dot layer, a second intermediate layer, a current block layer, a third intermediate layer, and an electron-doped layer are stacked in this order. The energy at a bottom of a conduction band in the current block layer is larger than the energy at a bottom of a conduction band in the intermediate layer and the thickness of the first intermediate layer is larger than the thickness of the third intermediate layer.

11 Claims, 5 Drawing Sheets

(51) Int. Cl.
*H01L 31/118* (2006.01)
*H01L 31/0352* (2006.01)
*H01L 31/0304* (2006.01)
*H01L 31/119* (2006.01)

(56) References Cited

U.S. PATENT DOCUMENTS 7,936,500 B2 * 5/2011 Powers .................. B82Y 20/00
250/226
8,890,272 B2 * 11/2014 Tkachuk ............... H01L 31/105
257/233
2006/0049394 A1 * 3/2006 Snyder .................. B82Y 10/00
257/14
2007/0215858 A1 9/2007 Uchiyama et al.

FOREIGN PATENT DOCUMENTS

| JP | 2004-349542 | 12/2004 |
| JP | 2006-012974 | 1/2006 |
| JP | 2007-242766 | 9/2007 |
| JP | 2008-091427 | 4/2008 |
| JP | 4571920 | 8/2010 |

* cited by examiner

INFRARED DETECTOR

CROSS-REFERENCE TO RELATED APPLICATIONS

This application is a national stage application of International Application No. PCT/JP2013/003560 entitled "INFRARED DETECTOR," filed on Jun. 6, 2013, which claims the benefit of the priority of Japanese Patent Application No. 2012-266162, filed on Dec. 5, 2012, the disclosures of each of which are hereby incorporated by reference in their entirety.

TECHNICAL FIELD

The present invention relates to an infrared detector, and more particularly, to an infrared detector that uses semiconductor quantum dots.

BACKGROUND ART

In recent years, there has been an increasing demand for infrared detectors for the purpose of executing thermal detection or measuring concentrations of carbon dioxide or air pollutants. There are a plurality of candidates for materials and structures of infrared detectors, and one of them is a Quantum Dot Infrared Photodetector (hereinafter referred to as "QDIP") in which semiconductor quantum dots are included in a light-absorbing layer.

The QDIP has a structure in which quantum dots are surrounded three-dimensionally by a semiconductor having a bandgap larger than that of materials forming the quantum dots. Further, electrons and holes are strongly confined in the quantum dots. As a result, discrete energy levels are formed in the quantum dots. Among these levels, a plurality of electron subband levels in a conduction band may be used to detect infrared light having energy corresponding to the difference in energy between subbands.

Patent Literature 1 discloses a photodetector capable of easily reducing a dark current to improve the performance of the detector.

Patent Literature 2 discloses an optical semiconductor device that can be easily manufactured and can sufficiently suppress a dark current and achieve optical detection with high sensitivity.

Patent Literature 3 discloses a quantum dot infrared detector having excellent properties because it achieves both easily growing of crystals forming a current block layer and a high potential barrier with respect to a dark current.

CITATION LIST

Non Patent Literature

[Patent Literature 1] Japanese Patent No. 4571920
[Patent Literature 2] Japanese Unexamined Patent Application Publication No. 2008-91427
[Patent Literature 3] Japanese Unexamined Patent Application Publication No. 2007-242766

SUMMARY OF INVENTION

Technical Problem

In general, detectors preferably have a high signal-to-noise ratio.

While it is required that an infrared detector introduce electrons in the quantum dots in advance, a certain percentage of electrons that have not been captured by the quantum dots are thermally excited and are detected as a current. This current is called a dark current since it is generated irrespective of light incident, and the dark current causes noise. In Patent Literature 3, the current block layer is provided to suppress the flow of thermally excited electrons, which flow will be a dark current. However, the flow of photoexcited electrons, which flow will be a photocurrent that it is desired to detect, is suppressed to the same degree that the flow of thermally excited electrons is suppressed. Therefore, it is impossible to increase the signal-to-noise ratio.

An exemplary object of the present invention is to provide an infrared detector having a high signal-to-noise ratio which can efficiently reduce the dark current compared to the photocurrent.

Solution to Problem

An infrared detector according to the present invention includes: a semiconductor substrate; a first contact layer formed on the semiconductor substrate; a light-absorbing layer formed on the first contact layer; a second contact layer formed on the light-absorbing layer; and a voltage source that applies a voltage between the first contact layer and the second contact layer, in which the light-absorbing layer includes at least one part in which a first intermediate layer, a quantum dot layer, a second intermediate layer, a current block layer, a third intermediate layer, and an electron-doped layer are stacked in this order, and the energy at a bottom of a conduction band in the current block layer is larger than the energy at a bottom of a conduction band in the intermediate layer and the thickness of the first intermediate layer is larger than the thickness of the third intermediate layer.

Further, an infrared detector according to the present invention includes: a semiconductor substrate; a first contact layer formed on the semiconductor substrate; a light-absorbing layer formed on the first contact layer; a second contact layer formed on the light-absorbing layer; and a voltage source that applies a voltage between the first contact layer and the second contact layer, in which the light-absorbing layer includes at least one part in which a first intermediate layer, an electron-doped layer, a second intermediate layer, a current block layer, a third intermediate layer, and a quantum dot layer are stacked in this order, and the energy at a bottom of a conduction band in the current block layer is larger than the energy at a bottom of a conduction band in the intermediate layer and the thickness of the first intermediate layer is larger than the thickness of the second intermediate layer.

Advantageous Effects of Invention

It is possible to provide an infrared detector having a high signal-to-noise ratio.

DESCRIPTION OF EMBODIMENTS

Hereinafter, with reference to the drawings, exemplary embodiments of the present invention will be described. Note that the present invention is not limited to the following exemplary embodiments.

First Exemplary Embodiment

Figure 1:
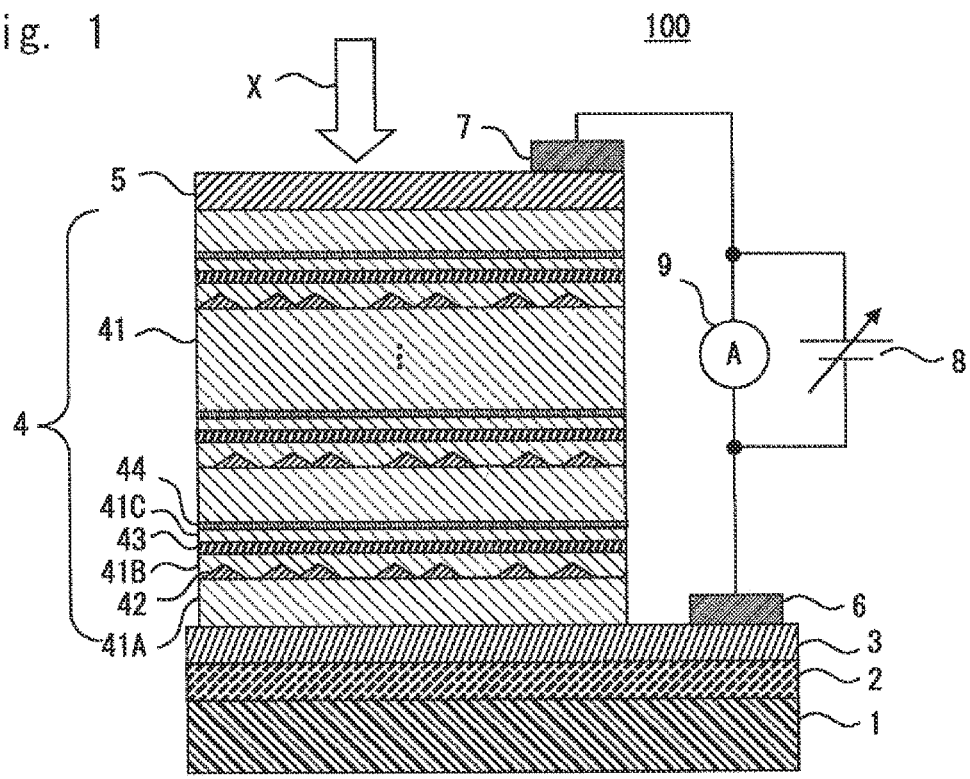
FIG. 1 is a cross-sectional view showing a structure of an infrared detector according to a first exemplary embodiment of the present invention.

FIG. 1 is a cross-sectional view showing a structure of an infrared detector 100 according to a first exemplary embodiment of the present invention.

As shown in FIG. 1, the infrared detector 100 includes a semiconductor substrate 1, a buffer layer 2, a lower contact layer 3 (first contact layer), a light-absorbing layer 4, an upper contact layer 5 (second contact layer), a lower electrode 6, an upper electrode 7, a voltage source 8, and an ammeter 9.

Specifically, the buffer layer 2 is formed on the semiconductor substrate 1. The buffer layer 2 is formed of the same semiconductor material as that of the semiconductor substrate 1. Further, the lower contact layer 3 is formed on the buffer layer 2. The lower contact layer 3 is mainly formed of an n-type semiconductor. Further, the light-absorbing layer 4 and the lower electrode 6 are formed on the lower contact layer. Further, the upper contact layer 5 is formed on the light-absorbing layer 4. The upper contact layer 5 is mainly formed of an n-type semiconductor. Further, the upper electrode 7 is formed on the upper contact layer 5. The lower contact layer 3 may be directly formed on the semiconductor substrate 1 without the buffer layer 2 being interposed therebetween.

Further, the lower electrode 6 and the upper electrode 7 are connected to each other via the voltage source 8. The ammeter 9 is connected between the lower electrode 6 and the upper electrode 7.

The voltage source 8 applies an appropriate voltage between the lower electrode 6 and the upper electrode 7. Further, the ammeter 9 measures a photocurrent that is generated by absorbing incident infrared light X by the light-absorbing layer 4 and that flows between the lower electrode 6 and the upper electrode 7.

The light-absorbing layer 4 includes an intermediate layer 41, a quantum dot layer 42, a current block layer 43, and an electron-doped layer 44.

Specifically, a first intermediate layer 41A, the quantum dot layer 42, a second intermediate layer 41B, the current block layer 43, a third intermediate layer 41C, the electron-doped layer 44, and again the first intermediate layer 41A are repeatedly formed in this order on the lower contact layer 3. The current block layer 43 is formed of a material having a higher energy at the bottom of a conduction band compared to the intermediate layer 41. By repeating such a stack at least ten times, it is possible to enhance the infrared absorption efficiency in the light-absorbing layer 4. FIG. 1 shows a state in which the stack is repeatedly performed only three times.

The quantum dot layers 42 that are repeatedly stacked are formed so that the quantum dot layers 42 are spaced apart from each other by about at least 50 nm in the stacking direction. This is because it is required that irregularities on the surface of the m (an integer equal to or larger than 1)-th quantum dot layer stacked gradually become flat because of the intermediate layer 41 and the like that are stacked next, and become substantially flat just before the (m+1)-th quantum dot layer is stacked.

Further, the thickness of the first intermediate layer 41A is larger than the thickness of the second and third intermediate layers 41B and 41C. The reason thereof will be described later in detail in the following operation explanation.

Figure 2:
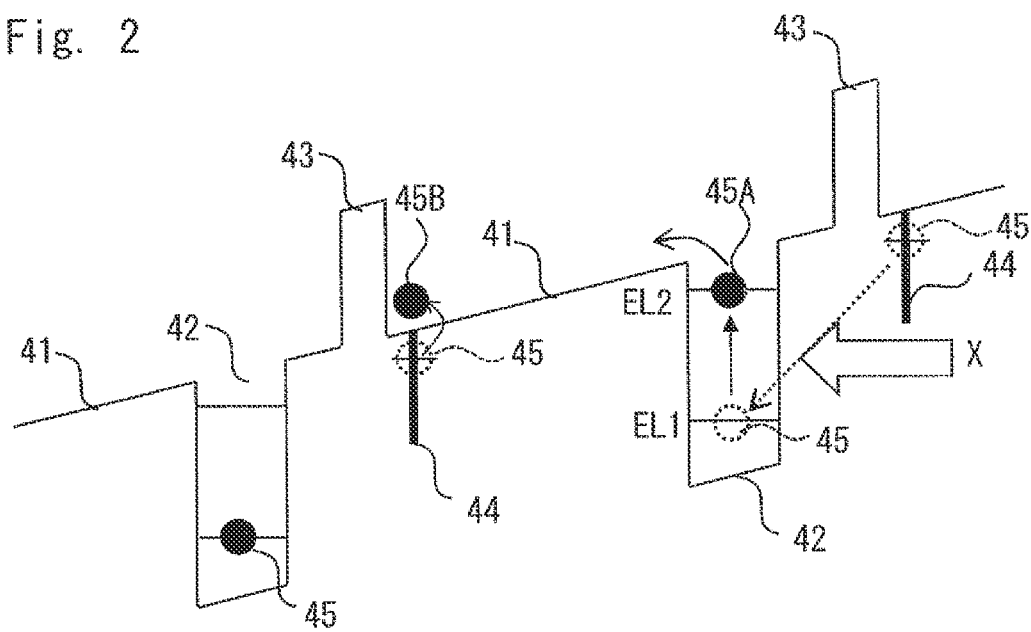
FIG. 2 is a view for describing an operation of the infrared detector according to the first exemplary embodiment of the present invention.

Next, an operation of the infrared detector 100 will be described. FIG. 2 shows an operation of the infrared detector 100 according to the first exemplary embodiment, and shows an electronic energy band diagram of a conduction band along the stacking direction (vertical direction in FIG. 1) when a voltage is applied. In FIG. 2, the left side is a side close to the substrate 1. The band rises upwardly because the potential on the right side (upper electrode side) is low, or in other words the electron potential energy is high.

Most of electrons 45 incorporated in the electron-doped layer 44 are captured by the quantum dot layer 42 having a lower potential energy (dotted arrow). When infrared light X (arrow in FIG. 2) having energy corresponding to the difference between a ground state EL1 of the electron and an excited state EL 2 of the electron is made incident in this state, the electron 45 in the quantum dot layer 42 absorbs the energy and makes a transition from the ground state to the excited state. A photoexcited electron 45A is thus generated.

As stated above, electrons that have not been captured by the quantum dot layer 42 remain in the electron-doped layer 44. Such an electron is thermally excited into the conduction band and becomes a thermally excited electron 45B.

The photoexcited electron 45A and the thermally excited electron 45B are attracted to the left side of the drawing due to an applied bias, and kinetic energy is added to the electrons travelling through the intermediate layer 41.

In this exemplary embodiment, the thickness of the first intermediate layer 41A is larger than that of the third intermediate layer 41C.

Accordingly, the travelling distance of the photoexcited electron 45A to reach the current block layer 43 is larger than that of the thermally excited electron 45B to reach the current block layer 43. Therefore, considering that the kinetic energy applied to the electrons in the process in which the electrons travel in the intermediate layer 41 is in proportion to the travelling distance, the kinetic energy added to the photoexcited electron 45A is larger than that added to the thermally excited electron 45B.

When the electrons reach the current block layer 43 in such circumstances, since the photoexcited electron 45A has a larger kinetic energy than that of the thermally excited electron 45B, the probability that the photoexcited electron 45A passes through the current block layer 43 is larger than the probability that the thermally excited electron 45B passes through the current block layer 43. In summary, the probability of suppressing dark current components can be made higher than that of suppressing photocurrent components. It is therefore possible to provide an infrared detector having a high signal-to-noise ratio compared to that of an infrared detector in which the photocurrent components and the dark current components are suppressed to the same degree.

In order to further improve the signal-to-noise ratio, the thickness of the first intermediate layer 41A is preferably made much larger than that of the third intermediate layer 41C. Specifically, the thickness of the first intermediate layer is preferably at least five times larger than that of the third intermediate layer, and more preferably, the thickness of the first intermediate layer is at least ten times larger than that of the third intermediate layer.

It is preferable that the height of the barrier energy and the thicknesses of the layers be set so that the transmittance of the photoexcited electron 45A in the current block layer 43 becomes high.

Incidentally, the thickness of the second intermediate layer 41B also affects the magnitude of the dark current. It has been described above that most of the electrons incorporated in the electron-doped layer 44 are captured by the quantum dot layer 42. Although this is correct when the electron-doped layer 44 and the quantum dot layer 42 are arranged close to each other, the probability that the electrons are captured by the quantum dots is reduced in accordance with an increase in the distance between the electron-doped layer 44 and the quantum dot layer 42. In the latter case, the electrons remain in the electron-doped layer, which generates a large amount of thermally excited electrons 45B, resulting in an increase in the dark current. In view of the above description, the distance between the electron-doped layer 44 and the quantum dot layer 42 is preferably short.

The distance between the electron-doped layer 44 and the quantum dot layer 42 corresponds to the sum of the second intermediate layer 41B, the current block layer 43, and the third intermediate layer 41C, and it is necessary that the thickness of the second intermediate layer 41B be small in order to reduce the dark current. The thickness of the second intermediate layer 41B is preferably 10 nm or smaller.

However, when the current block layer 43 is formed of AlGaAs and the quantum dot layer 42 is formed of InAs, for example, since the deposition temperature of AlGaAs is high, the quantum dot layer 42 formed of InAs whose melting point is low is deformed if the intermediate layer 41B is too thin, which leads to a reduction in optical detection efficiency. Therefore, it is required to be careful not to reduce the thickness of the intermediate layer 41B too much depending on its material.

As described above, in the light-absorbing layer including the structure in which the first intermediate layer, the quantum dot layer, the second intermediate layer, the current block layer, the third intermediate layer, the electron-doped layer, and again the first intermediate layer are stacked in this order, the energy at the bottom of the conduction band in the current block layer is larger than the energy at the bottom of the conduction band in the intermediate layer, and the thickness of the first intermediate layer is larger than the thickness of the third intermediate layer, whereby it is possible to efficiently interrupt the dark current, not the photocurrent, and to provide an infrared detector having a high signal-to-noise ratio.

The thickness of the first intermediate layer is preferably at least five times larger than the thickness of the third intermediate layer, and the thickness of the second intermediate layer is preferably 10 nm or smaller.

As described in Background Art, it is required to introduce electrons in the quantum dots in advance in the QDIP (Patent Literature 1). When the electrons are introduced, n-type impurities such as silicon (Si) are introduced at the same time that the quantum dots are formed. However, since the plane occupancy of the quantum dots is not 100%, the above doped electrons are not always captured by the quantum dots. A certain percentage of electrons that have not been captured by the quantum dots are thermally excited and are detected as a dark current.

Besides electrons being introduced in the quantum dots, which is required for the infrared detection operation, the electron-doped layer may be formed near the quantum dots. One example of such a case is a method for performing modulation doping (δ doping) on an n-type impurity layer in such a way that the n-type impurity layer is provided directly above the quantum dots and has a quite small thickness and the distance between the n-type impurity layer and the quantum dots is within 10 nm to improve the infrared detection sensitivity (Patent Literature 2). A certain percentage of electrons in the n-type impurity layer are also thermally excited to generate a dark current, which causes noise.

In either case described above, it is required to reduce the dark current. In order to reduce the dark current, a current block layer made of aluminium gallium arsenide (AlGaAs) having a large bandgap energy is disposed immediately above the quantum dots in Patent Literature 3. At this time, the quantum dots are formed of indium arsenide (InAs) and intermediate layers that are interposed between the multilayer quantum dots are formed of gallium arsenide (GaAs).

Figure 6:
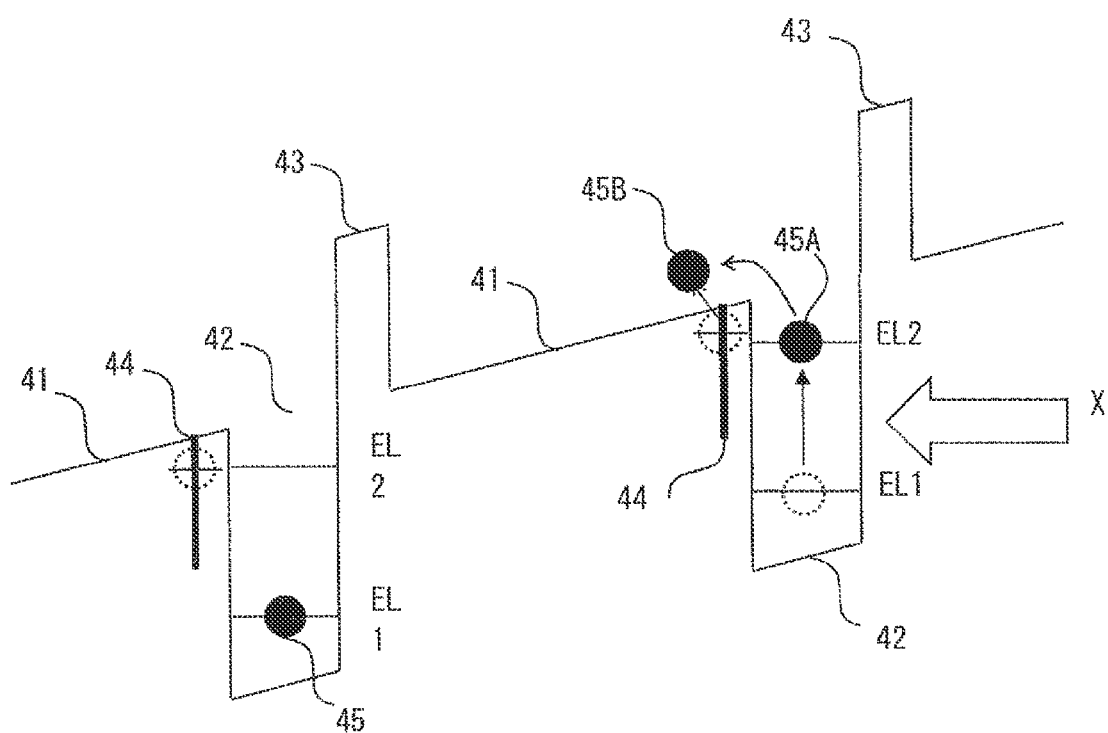
FIG. 6 is a view for describing an operation of an infrared detector including a current block layer according to a related art.

FIG. 6 schematically shows a current block operation of the infrared detector including the quantum dots including the current block layer disclosed in Patent Literature 3, etc. FIG. 6 shows a conduction band energy band of the cross section of the infrared detector including the quantum dots when a voltage is applied.

As described above, the electrons are introduced in the quantum dot layer or the periphery thereof. Accordingly, in FIG. 6, the electron generated by incident infrared which it is desired to measure (photocurrent electron) and the electron generated regardless of the incident light (dark current electron) are generated in spatial proximity to each other.

In FIG. 6, the thermally excited electron from the electron-doped layer has been described as an example of the source of the dark current electron. The electrons are introduced only in this layer, and it can be considered that this effect is the largest.

FIG. 6 shows a state in which a voltage is applied so that the electron potential energy on the right side of FIG. 6 becomes high. At this time, when infrared light X (arrow in FIG. 6) having an energy corresponding to the difference between the ground state EL1 of the electron and the excited state EL2 of the electron is made incident, the electron absorbs the energy and makes a transition from the ground state to the excited state. The photoexcited electron 45A is thus generated.

On the other hand, the electron in the electron-doped layer 44 is captured by the quantum dots to be in the ground level EL1, or a certain percentage of electrons are thermally excited into the conduction band to become the thermally excited electron 45B.

The photoexcited electron 45A and the thermally excited electron 45B are attracted to the left side of FIG. 6 by an applied bias, and kinetic energy is added when the electrons travel through the intermediate layer 41. The kinetic energy applied to the photoexcited electron and the kinetic energy applied to the thermally excited electron are about the same. Accordingly, the probability that the photoexcited electron 45A can pass through the current block layer 43 having a high potential energy which is located in the downstream and the probability that the thermally excited electron 45B can pass through the current block layer 43 are about the same. That is, this current block layer suppresses the flow of the thermally excited electron, which will be a dark current that it is desired to suppress, and the flow of the photoexcited electron which will be a photocurrent that it is desired to detect to the same degree.

Compared to the related art, in the infrared detector 100 according to the first exemplary embodiment as described above, it is possible to efficiently interrupt the dark current. It is therefore possible to provide an infrared detector having a high signal-to-noise ratio.

Next, a method for manufacturing the infrared detector 100 according to the first exemplary embodiment of the present invention will be described.

(1) Crystal Growth Including Quantum Dots

A GaAs substrate having a plane orientation of (001) is prepared as the semiconductor substrate 1, and this GaAs substrate is introduced in a molecular beam epitaxial (MBE) apparatus. After a natural oxide is removed, the temperature of the substrate is set to about 580° C., and the buffer layer 2 is stacked so that the buffer layer 2 has a thickness of 500 nm. Similar to the semiconductor substrate 1, the buffer layer 2 is formed of GaAs.

Next, the n-type lower contact layer 3 is stacked so that the n-type lower contact layer 3 has a thickness of 500 nm. The lower contact layer 3 is formed of GaAs that has been doped with Si atoms at the concentration of about $2 \times 10^{18}$ cm$^{-3}$.

Next, the i-type first intermediate layer 41A is stacked so that the i-type first intermediate layer 41A has a thickness of 50 nm. The i-type first intermediate layer 41 is formed of GaAs.

After that, the substrate temperature is lowered to about 490° C., and InAs is supplied so that the thickness of InAs becomes equal to about two to three atomic layers.

At this time, because of the strain occurring due to the difference between the lattice constant of InAs and that of GaAs, InAs is grown three-dimensionally into the form of an island. The quantum dots called a Stranski-Krastanov (SK) mode are thus formed. As a result, the quantum dot layer 42 in which quantum dots are arranged on a plane is formed. The quantum dots typically have a diameter of 30 nm, a height of 5 nm, and a number concentration per one square centimeter of about $5 \times 10^{10}$.

Next, the substrate temperature is raised again to stack the i-type second intermediate layer 42B formed of GaAs having a thickness of about 5 nm, the i-type current block layer 43 formed of AlGaAs having a thickness of about 10 nm, and the i-type third intermediate layer 42C formed of GaAs having a thickness of about 5 nm. The electron-doped layer 44 doped with n-type impurities such as Si atoms and then again the first intermediate layer 41A are stacked.

Here, the amount of impurities incorporated in the electron-doped layer 44 is adjusted so that an average of one electron is incorporated in each of the quantum dots in the quantum dot layer 42. Specifically, the surface density is preferably within a range from one fifth of to five times as large as the surface density N of the quantum dots. The thickness of the electron-doped layer 44 may be as extremely small as that of a sheet or may be about 5 nm. In particular, the former one may be referred to as δ doping.

According to the aforementioned procedure, the stack of the first intermediate layer 41A, the quantum dot layer 42, the second intermediate layer 41B, the current block layer 43, the third intermediate layer 41C, and the electron-doped layer 44 is repeated at least ten times. It is therefore possible to form the light-absorbing layer 4.

Last, the n-type upper contact layer 5 having a thickness of 200 nm is stacked. The n-type upper contact layer 5 is formed of GaAs doped with Si atoms at the concentration of about $2 \times 10^{18}$ cm$^{-3}$.

The quantum dot layer 42 formed of InAs may be formed of indium gallium arsenide (InGaAs). Further, the intermediate layer 41 may be formed of AlGaAs. It is necessary, however, that the Al composition ratio of the intermediate layer 41 be made smaller than that of the current block layer 43 so that the bandgap energy of the intermediate layer 41 becomes smaller than that of the current block layer 43.

While the light-absorbing layer 4 including the quantum dot layer 42 and the peripheral structures thereof are formed by the MBE method in the above manufacturing method, they may be manufactured by any other method. For example, these structures may be formed by another crystal growth method such as a Metal Organic Chemical Vapor Deposition (MOCVD method).

(2) Detector Structure Processing and Electrode Process

Next, a part of the upper contact layer 5, the light-absorbing layer 4, and the lower contact layer 3 are selectively etched using a technique such as ultraviolet lithography, dry etching or wet etching. As a result, a part of the surface of the lower contact layer 3 is exposed.

As a result of this selective etching, the separated structure becomes one element of the infrared detector 100. While differing depending on the application, the size of the light-receiving surface of the infrared detector 100 is typically from about 20 μm to 500 μm. The infrared detector 100 may be composed of only one element, or it may be composed of an array of such elements which are aligned in a line or two-dimensionally aligned.

Next, an alloy ohmic electrode formed of AuGe/Ni/Au is formed in the upper contact layer 5 and the lower contact layer 3 to form the upper electrode 7 and the lower electrode 6. The upper electrode 7 and the lower electrode 6 are each formed by a lift-off method. The lift-off method includes processes such as lithography, metal deposition, and resist stripping.

According to the above processes, the basic structure of the infrared detector 100 according to the first exemplary embodiment is completed.

Second Exemplary Embodiment

Figure 3:
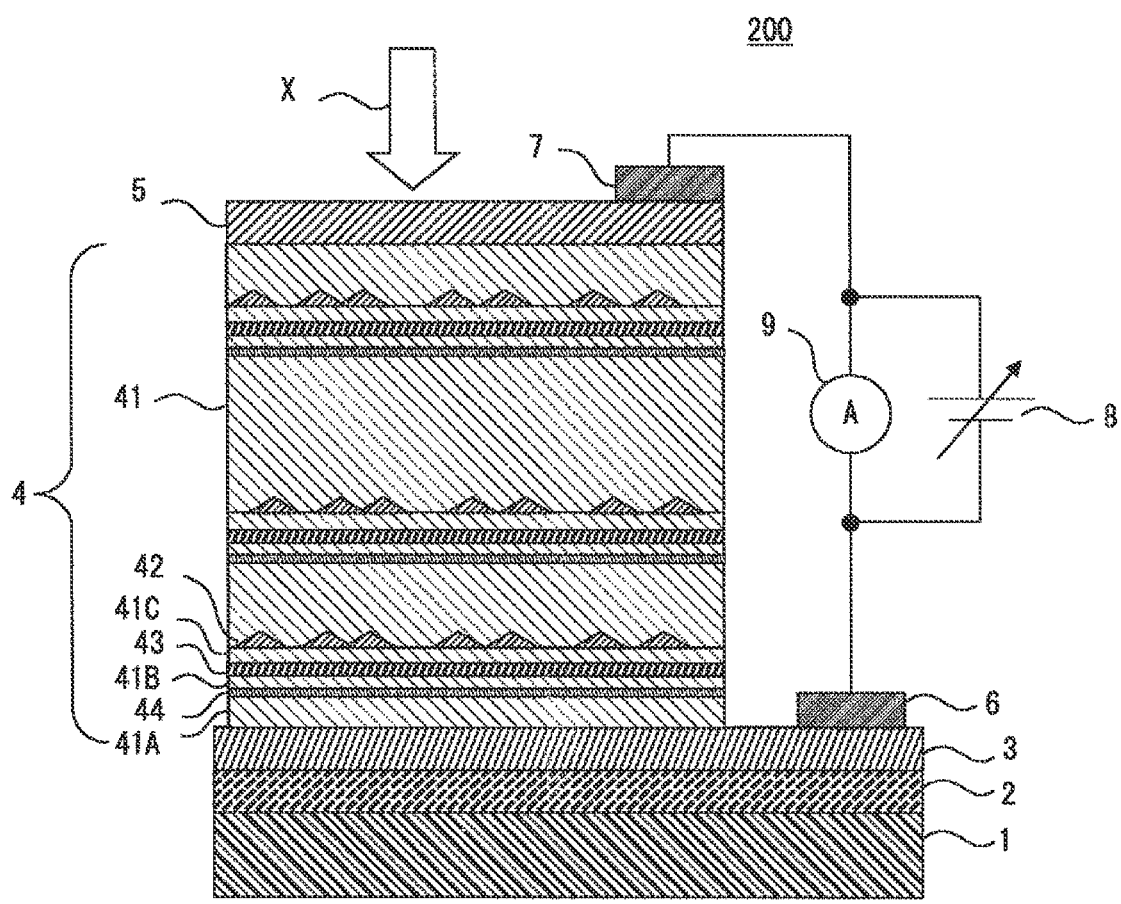
FIG. 3 is a cross-sectional view showing a structure of an infrared detector according to a second exemplary embodiment of the present invention.

FIG. 3 is a cross-sectional view for describing a structure of an infrared detector 200 according to a second exemplary embodiment of the present invention.

As shown in FIG. 3, the infrared detector 200 according to the second exemplary embodiment differs from the infrared detector 100 according to the first exemplary embodiment only in terms of the order of stack of the layers forming the light-absorbing layer 4. Specifically, the infrared detector 200 differs from the infrared detector 100 in that the first intermediate layer 41A, the electron-doped layer 44, the second intermediate layer 41B, the current block layer 43, the third intermediate layer 41C, the quantum dot layer 42, and again the first intermediate layer 41A are stacked in this order. Since the other structures in this exemplary embodiment are the same as those in the first exemplary embodiment, the description thereof will be omitted.

Figure 4:
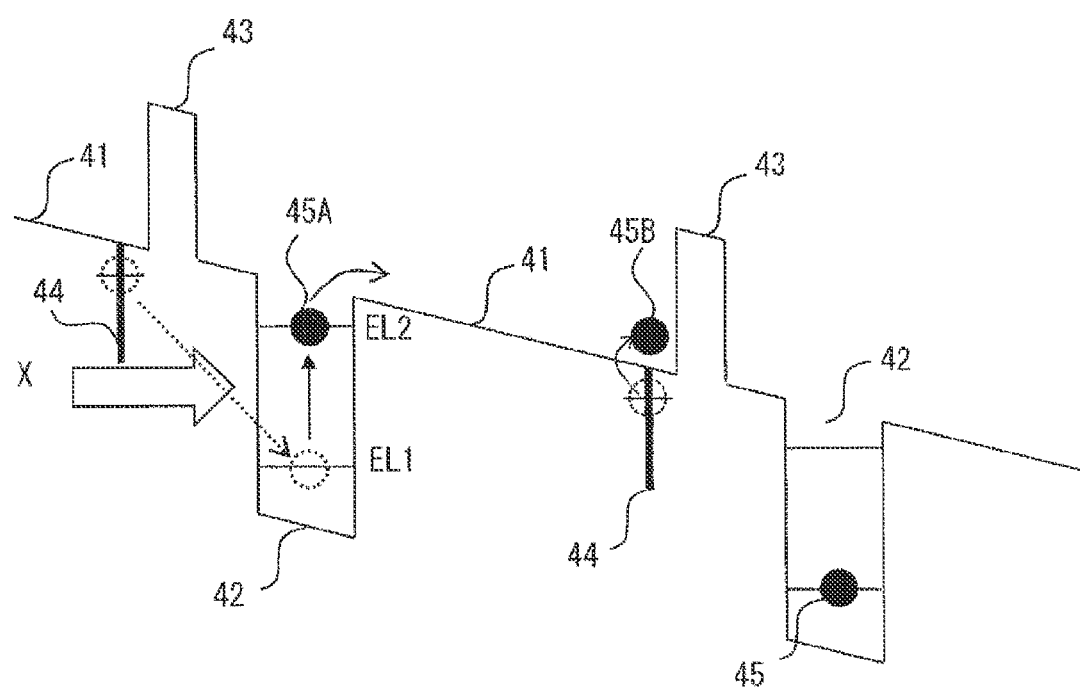
FIG. 4 is a view for describing an operation of the infrared detector according to the second exemplary embodiment of the present invention.

Next, an operation of the infrared detector 200 will be described. FIG. 4 shows an operation of the infrared detector 200 according to the second exemplary embodiment, and shows an electronic energy band diagram of a conduction band along the stacking direction (vertical direction in FIG. 3) when a voltage is applied. In FIG. 4, the left side is a side close to the substrate 1. The band falls downwardly because the potential on the right side (upper electrode side) is high, or in other words the electron potential energy is low.

A comparison between FIG. 4 and FIG. 2 shows that the order of stack is changed and the sign of the applied voltage is changed, as a result of which right and left are reversed. Therefore, the operation in this exemplary embodiment is the same as that in the first exemplary embodiment already described above except that right and left are reversed. Accordingly, only the conclusion of the operation will be described below.

In the light-absorbing layer having a structure in which the first intermediate layer, the electron-doped layer, the second intermediate layer, the current block layer, the third intermediate layer, and the quantum dot layer are stacked in this order, the energy at the bottom of the conduction band in the current block layer is larger than the energy at the bottom of the conduction band in the intermediate layer and the thickness of the first intermediate layer is larger than the thickness of the second intermediate layer. It is therefore possible to efficiently interrupt the dark current, not the photocurrent, and to provide an infrared detector having a high signal-to-noise ratio.

Note that the thickness of the first intermediate layer is preferably at least five times larger than the thickness of the second intermediate layer and the thickness of the third intermediate layer is preferably equal to or smaller than 10 nm.

Further, since the manufacturing method in this exemplary embodiment is the same as that stated above except for the order of stack, the description thereof will be omitted.

Third Exemplary Embodiment

Figure 5:
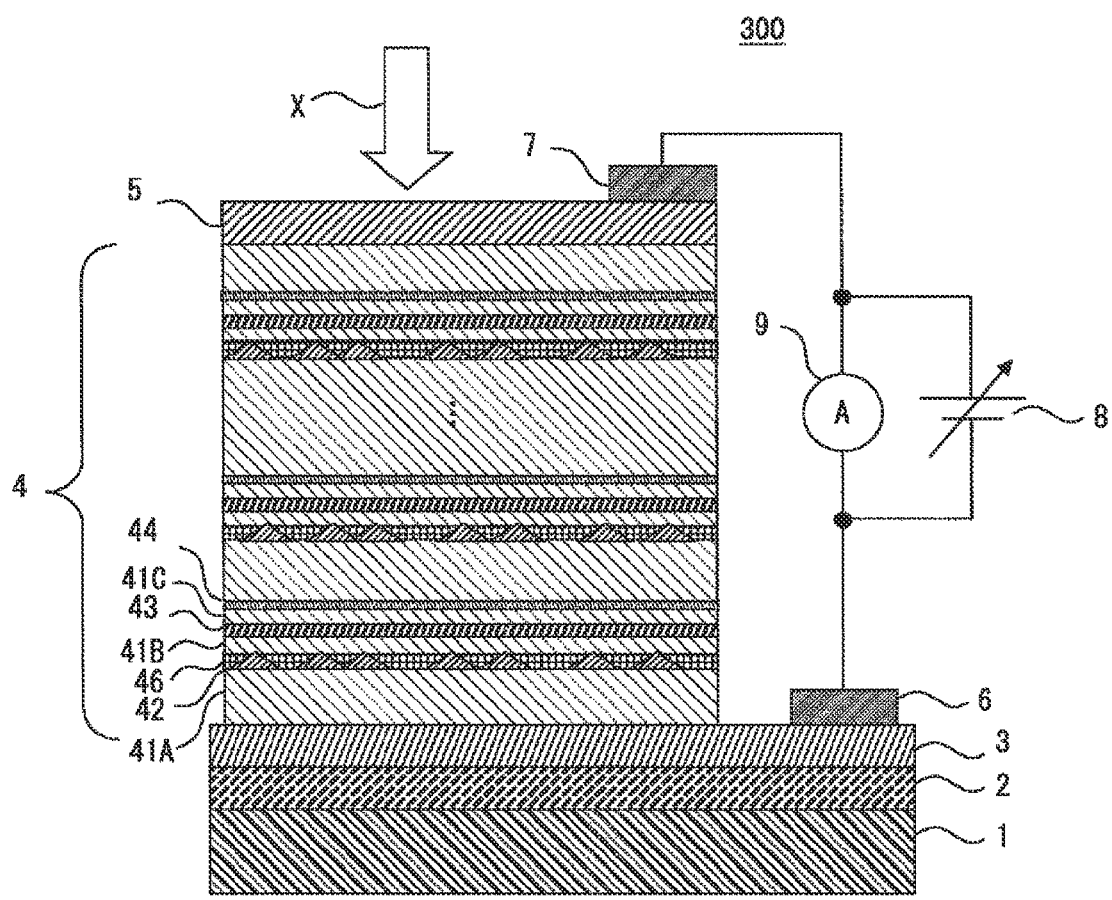
FIG. 5 is a cross-sectional view showing a structure of an infrared detector according to a third exemplary embodiment of the present invention.

FIG. 5 is a cross-sectional view for describing a structure of an infrared detector 300 according to a third exemplary embodiment of the present invention. As shown in FIG. 5, the infrared detector 300 according to the third exemplary embodiment has a structure in which a cap layer 46 is stacked between the quantum dot layer 42 and the second intermediate layer 41B in the infrared detector 100 according to the first exemplary embodiment, and the parts other than this structure are the same as those of the first exemplary embodiment.

The cap layer 46 is formed of InGaAs when, for example, the quantum dot layer 42 and the intermediate layer 41 are formed of InAs and GaAs, respectively. When the second intermediate layer 41B made of GaAs is stacked on the InAs quantum dot layer 42 via the InGaAs cap layer 46, the InGaAs cap layer serves to relax the strain occurring due to the difference between the lattice constant of InAs and that of GaAs. Accordingly, this cap layer may be referred to as a strain relaxation layer.

Such a relaxation of the strain changes the potential energy of the electron, which results in a change in the electron subband energy. This means that the wavelength that can be detected by the infrared detector changes. Since the amount of change in a wavelength can be controlled by the thickness of the cap layer and the composition ratio of In and Ga of InGaAs, it can be used as a wavelength control method of the infrared detector. The cap layer typically has a thickness of about 5 nm and the composition ratio of In and Ga is typically 0.15:0.85.

The operation principles in the third exemplary embodiment are substantially the same as those in the first exemplary embodiment described in FIG. 2. This is because, while the shape of the band of the quantum dot layer 42 in FIG. 2 slightly changes due to the introduction of the cap layer 46, the shapes and the positional relation of the current block layer 43 and the electron-doped layer 44 do not substantially change. Accordingly, the description thereof will be omitted.

Further, since the manufacturing method in this exemplary embodiment is substantially the same as that already stated above, the description thereof will be omitted.

As stated above, compared to the case in which there is no cap layer, it is possible to change the wavelength that can be detected by introducing the cap layer just above the quantum dot layer. Further, it is possible to provide an infrared detector having a high signal-to-noise ratio, similar to those of the first and second exemplary embodiments.

Note that the present invention is not limited to the above exemplary embodiments and may be changed as appropriate without departing from the spirit of the present invention. For example, the infrared detector 100 shown in the first exemplary embodiment may further include components other than the components described above.

This application is based upon and claims the benefit of priority from Japanese Patent Application No. 2012-266162, filed on Dec. 5, 2012, the disclosure of which is incorporated herein in its entirety by reference.

REFERENCE SIGNS LIST

1 Semiconductor Substrate
2 Buffer Layer
3 Lower Contact Layer (First Contact Layer)
4, 4A Light-Absorbing Layers
41 Intermediate Layer
41A First Intermediate Layer
41B Second Intermediate Layer
41C Third Intermediate Layer
42 Quantum Dot Layer
43 Current Block Layer
44 Electron-Doped Layer
45 Electron
45A Photoexcited Electron (Photocurrent Electron)
45B Thermally Excited Electron (Dark Current Electron)
46 Cap Layer
5 Upper Contact Layer (Second Contact Layer)
6 Lower Electrode
7 Upper Electrode
8 Voltage Source
9 Ammeter
100, 200, 300 Infrared Detectors

The invention claimed is:

1. An infrared detector comprising:
a semiconductor substrate;
a first contact layer formed on the semiconductor substrate;
a light-absorbing layer formed on the first contact layer;
a second contact layer formed on the light-absorbing layer; and
a voltage source that applies a voltage between the first contact layer and the second contact layer; wherein:
the light-absorbing layer comprises at least one part in which a first intermediate layer, an electron-doped layer, a second intermediate layer, a current block layer, a third intermediate layer, and a quantum dot layer are stacked in this order, and
the energy at a bottom of a conduction band in the current block layer is larger than the energy at a bottom of a conduction band in the intermediate layer and the thickness of the first intermediate layer is larger than the thickness of the second intermediate layer.

2. The infrared detector according to claim 1, wherein:
the infrared detector operates using the voltage source in a state in which a potential of the second contact layer is higher than that of the first contact layer, and
the probability that the current block layer interrupts a dark current that is generated irrespective of incident infrared is higher than the probability that the current block layer interrupts a photocurrent generated by the incident infrared.

3. The infrared detector according to claim 1, wherein the thickness of the first intermediate layer is at least five times larger than the thickness of the second intermediate layer.

4. The infrared detector according to claim 1, wherein the thickness of the third intermediate layer is equal to or smaller than 10 nm.

5. The infrared detector according to claim 1, wherein the first to third intermediate layers are formed of GaAs, the quantum dot layer is formed of InAs or InGaAs, and the current block layer is formed of AlGaAs.

6. An infrared detector comprising:
a semiconductor substrate;
a first contact layer formed on the semiconductor substrate;
a light-absorbing layer formed on the first contact layer;
a second contact layer formed on the light-absorbing layer; and
a voltage source that applies a voltage between the first contact layer and the second contact layer; wherein:
the light-absorbing layer comprises at least one part in which a first intermediate layer, a quantum dot layer, a second intermediate layer, a current block layer, a third intermediate layer, and an electron-doped layer are stacked in this order, and
the energy at a bottom of a conduction band in the current block layer is larger than the energy at a bottom of a conduction band in the intermediate layer and the thickness of the first intermediate layer is larger than the thickness of the third intermediate layer.

7. The infrared detector according to claim 6, wherein the infrared detector comprises a cap layer between the quantum dot layer and the second intermediate layer.

8. The infrared detector according to claim 6, wherein:
the infrared detector operates using the voltage source in a state in which a potential of the second contact layer is lower than that of the first contact layer, and
the probability that the current block layer interrupts a dark current that is generated irrespective of incident infrared is higher than the probability that the current block layer interrupts a photocurrent generated by the incident infrared.

9. The infrared detector according to claim 6, wherein the thickness of the first intermediate layer is at least five times larger than the thickness of the third intermediate layer.

10. The infrared detector according to claim 6, wherein the thickness of the second intermediate layer is equal to or smaller than 10 nm.

11. The infrared detector according to claim 6, wherein the first to third intermediate layers are formed of GaAs, the quantum dot layer is formed of InAs or InGaAs, and the current block layer is formed of AlGaAs.

* * * * *